US007029080B2

(12) United States Patent
Barry, Jr. et al.

(10) Patent No.: US 7,029,080 B2
(45) Date of Patent: Apr. 18, 2006

(54) SLIDE RAIL HAVING FRONT RELEASE LATCH

(75) Inventors: Alfred E. Barry, Jr., Atlanta, GA (US); Yang Wenming, Singapore (SG)

(73) Assignee: Central Industrial Supply Company, Grand Prairie, TX (US)

( * ) Notice: Subject to any disclaimer, the term of this patent is extended or adjusted under 35 U.S.C. 154(b) by 124 days.

(21) Appl. No.: 10/255,230

(22) Filed: Sep. 25, 2002

(65) Prior Publication Data

US 2005/0116594 A1 Jun. 2, 2005

(51) Int. Cl.
*A47B 88/00* (2006.01)

(52) U.S. Cl. ................................ 312/333; 312/334.44

(58) Field of Classification Search ............. 312/330.1, 312/334.4, 334.7, 350, 334.14, 334.12, 334.46, 312/334.44, 334.17, 334.16, 334.11, 333, 312/334.47; 384/21
See application file for complete search history.

(56) References Cited

U.S. PATENT DOCUMENTS

| | | | | |
|---|---|---|---|---|
| 3,123,419 A | | 3/1964 | Maxwell | |
| 3,133,768 A | | 5/1964 | Klakovich | |
| 3,462,203 A | | 8/1969 | Del Veccchio | |
| 4,272,139 A | | 6/1981 | Fler | |
| 4,370,007 A | | 1/1983 | Fler | |
| 4,441,772 A | | 4/1984 | Fielding et al. | |
| 4,469,384 A | | 9/1984 | Fler et al. | |
| 4,549,773 A | | 10/1985 | Papp et al. | |
| 4,560,212 A | | 12/1985 | Papp et al. | |
| 4,679,950 A | | 7/1987 | Delmege et al. | |
| 4,872,734 A | | 10/1989 | Rechberg | |
| 4,932,792 A | * | 6/1990 | Baxter | 384/18 |
| 4,993,847 A | | 2/1991 | Hobbs | |
| 5,033,805 A | | 7/1991 | Hobbs | |
| 5,169,238 A | | 12/1992 | Schenk | |
| 5,309,323 A | | 5/1994 | Gray et al. | |
| 5,405,195 A | | 4/1995 | Hobbs | |
| 5,411,333 A | * | 5/1995 | Hoffman | 384/18 |
| 5,722,750 A | | 3/1998 | Chu | |

(Continued)

FOREIGN PATENT DOCUMENTS

DE 3347540 A1 * 7/1985

(Continued)

OTHER PUBLICATIONS

EPO., ESPACENET Abstract and Front Page of DE 20106080U.

(Continued)

*Primary Examiner*—Janet M. Wilkens
(74) *Attorney, Agent, or Firm*—Mark W. Handley; Chauza & Handley, L.L.P.

(57) ABSTRACT

A slide rail assembly (46) has first and second slide rails (50, 52), with the second slide rail (52) being telescopically extendible from the first slide rail (50). A latch member (122) is moveably mounted to the second slide rail (52) for engaging a catch portion (140) of the first slide rail (50) to latch the second slide rail (52) in a forward, extended position, cantilevered from the first slide rail (50). A release member (56) is slidably mounted to the second slide rail (52), and extends from a forward portion of the second slide rail (52) to an intermediate portion of the second slide rail (52) which is disposed substantially adjacent to the latch member (122). Movement of the release member (56) lineally moves the latch member (122) from engaging the catch portion (140) of the first slide rail (48) and releases the second slide rail (52) to move from the extended position.

20 Claims, 9 Drawing Sheets

U.S. PATENT DOCUMENTS

| | | | | |
|---|---|---|---|---|
| 5,730,514 | A | 3/1998 | Hashemi | |
| 5,757,109 | A | 5/1998 | Parvin | |
| 5,871,265 | A | 2/1999 | Stewart et al. | |
| 5,951,132 | A * | 9/1999 | Cirocco | 312/334.46 |
| 5,961,193 | A | 10/1999 | Hobbs | |
| 5,988,780 | A | 11/1999 | Rock et al. | |
| 6,126,255 | A | 10/2000 | Yang | |
| 6,209,979 | B1 | 4/2001 | Fall et al. | |
| 6,224,177 | B1 | 5/2001 | Chu | |
| 6,238,031 | B1 | 5/2001 | Weng | |
| 6,244,678 | B1 | 6/2001 | Dopp et al. | |
| 6,296,338 | B1 * | 10/2001 | Stijns | 312/333 |
| 6,340,212 | B1 | 1/2002 | Beiss et al. | |
| 6,367,899 | B1 | 4/2002 | Hwang et al. | |
| 6,375,290 | B1 | 4/2002 | Lin et al. | |
| 6,390,575 | B1 | 5/2002 | Chen et al. | |
| 6,412,891 | B1 | 7/2002 | Liang et al. | |
| 6,450,600 | B1 | 9/2002 | Chen et al. | |
| 6,554,379 | B1 * | 4/2003 | Devine | 312/333 |
| 6,655,763 | B1 * | 12/2003 | Judge et al. | 312/334.46 |
| 2002/0089272 | A1 | 7/2002 | Liang et al. | |
| 2002/0089274 | A1 | 7/2002 | Liang et al. | |
| 2003/0209958 | A1 * | 11/2003 | Hwang et al. | 312/334.46 |

FOREIGN PATENT DOCUMENTS

| | | | |
|---|---|---|---|
| DE | 43 07 911 | A1 | 9/1994 |
| DE | 201 06 081 | U1 | 8/2001 |
| DE | 20113886 | U1 | 1/2002 |
| DE | 20115196 | U1 | 1/2002 |
| DE | 20116513 | U1 | 2/2002 |
| DE | 20202750 | U1 | 7/2002 |
| DE | 20205772 | U1 | 8/2002 |
| EP | 0 421 275 | A1 | 4/1991 |
| JP | 03165712 | A * | 7/1991 |
| WO | WO 02/065875 | A2 | 8/2002 |

OTHER PUBLICATIONS

EPO., ESPACENET Abstract and Front Page of DE 20106081U.
EPO., ESPACENET Abstract and Front Page of DE 20116057U.
EPO., ESPACENET Abstract and Front Page of DE 20116328U.
EPO., ESPACENET Abstract of DE4307911A1.
Derwent Abstract of DE 20115196U1.
Derwent Abstract of DE 20202750U1.
Derwent Abstract of DE 20116513U1.
Derwent Abstract of DE 20113886U1.

* cited by examiner

SLIDE RAIL HAVING FRONT RELEASE LATCH

TECHNICAL FIELD OF THE INVENTION

The present invention relates in general to the slide rail assemblies for drawers, cabinets and equipment racks, and in particular to a slide assembly having a latch with a front release.

BACKGROUND OF THE INVENTION

Slide rail assemblies have been provided for use in furniture, cabinets, equipment racks, server system racks, and such, in which drawers, equipment units, work surfaces, and the like are extendible from within the furniture, cabinets, equipment racks and server system racks. Slide rail assemblies typically have at least two telescoping members, which include a forward slide rail and a rearward slide rail. The rearward slide rail is typically mounted to a cabinet, equipment rack, or the like, and the forward slide rail is telescopically extendible into a cantilevered position, disposed forward of the rearward slide rail. The forward slide rails are usually mounted inward of the rearward slide rails, such that the outwardly disposed slide rails are mounted to the cabinets and the inner slide rails are mounted drawers which extend forward of the cabinets. Prior art slide rail assemblies have included both friction slide rail assemblies and bearing slide rail assemblies. Friction slide rail assemblies typically have at least two telescopically extendible slide rails which include tracks that define mating bearing faces for slidably engaging, such that one of the slide rails is extendible to cantilevered positions with respect to the other of the slide rails. Bearing slide rail assemblies have at least two telescopically extendible slide rails, except unlike the friction slide rails, bearing slide rails include moveable bearings, such as ball bearings, roller bearings, and the like.

In some applications, the forward slide rails are latched into forwardly disposed positions with respect to the rearward slide rails. Prior art slide rail assembly latches are typically released by users pushing on portions of the slide rail assembly latches at the junctions of the rearward and the forward slide rails, to release the forward slide rails from being latched in forwardly disposed positions. The forward junctions between the mating slide rails often provide pinch points at which the users may be injured when operating such prior art slide rails. When prior art slide rail assemblies are used to support large drawers or large equipment racks in cantilevered, forward positions, it is often difficult for the users to simultaneously reach around opposite sides of the large drawers or equipment racks and release the slide rail assembly latches on the opposite sides at the same time, making the slide rail assembly installations more difficult to operate and increasing the chances of injury to the users by having fingers or hands caught in the pinch points between the telescopically extendible slide rails.

SUMMARY OF THE INVENTION

A slide rail assembly is provided having first and second slide rails, with the second slide rail being telescopically extendible from the first slide rail. A latch is provided for releasably securing the second slide rail in an extended position, forward of the first slide rail. The latch includes at least one catch member which extends from the first slide rail and a latch member which is moveably mounted to the second slide rail. The catch member and the latch member are mounted such that the latch member is aligned with the catch member when the second slide rail is disposed in the extended position, and the latch member engages the catch member to releasably secure the second slide rail in the extended position. A forwardly extending release member is slidably mounted to the second slide rail for moving in a lineal direction. The release member extends from a forward portion of the second slide rail to an intermediate portion of the second slide, to which the latch member is slidably mounted. The latch member includes a first side having a cam follower member and a second side having stop surfaces which engage a tab of the catch portion of the first slide rail. The release member includes a cam portion which engages the cam follower member of the latch member, such that movement of the release member in a forward direction lineally moves the latch member from engaging the catch member of the first slide rail. With the latch member moved from engaging the catch member, the second slide rail may be moved relative to the first slide rail, from the extended position to another position with respect to the first slide rail.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
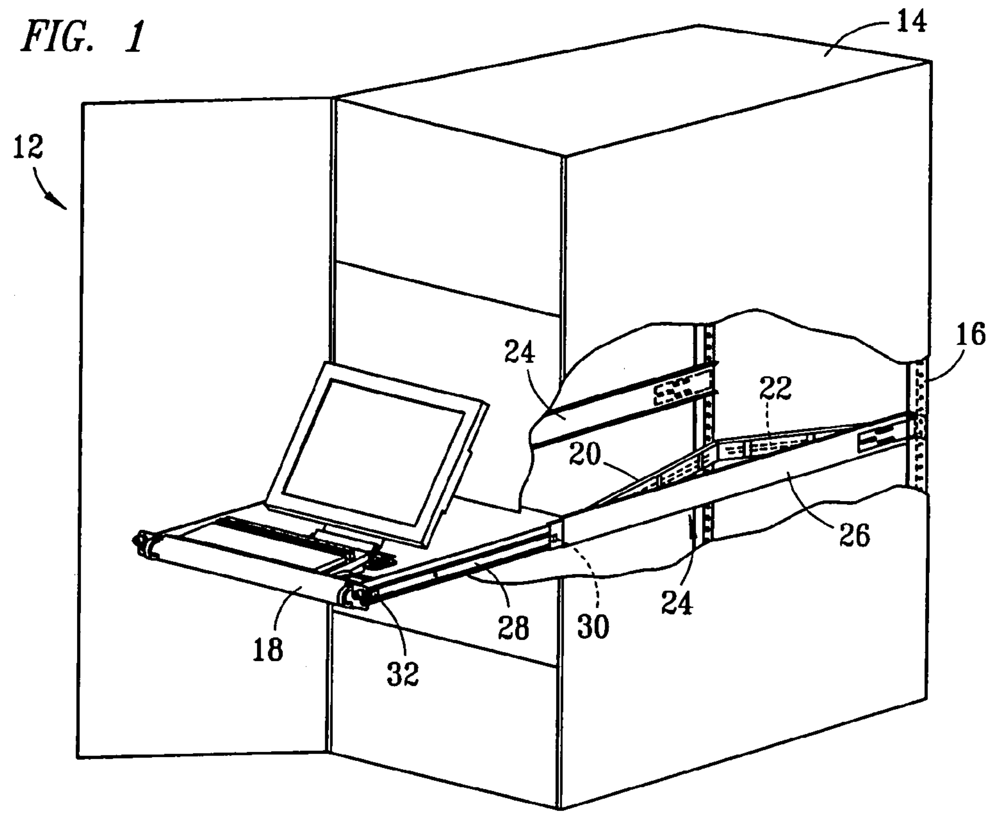
FIG. 1 is a cutaway, perspective view of an equipment cabinet having a drawer which is mounted to the cabinet by two slide rail assemblies.

FIG. 1 is a cutaway, perspective view of an equipment rack 12 of a cabinet 14. The equipment rack 12 includes a rack frame 16 to which a drawer 18 is slidably mounted. A cable management arm 20 provides a flexible member which extends between the drawer 18 and the rack frame 16 to secure cabling 22. Opposite sides of the drawer 18 are mounted to the frame 16 by two slide rail assemblies 24. The slide rail assemblies 24 are two-part slide rail assemblies, each including a rearwardly disposed slide rail 26 and a forward slide rail 28. The rearward slide rail 26 is fixedly mounted to the frame 16 for mounting the slide rail assembly 24 to the cabinet 14. The forward slide rail 28 is slidably extendible from within the rearward slide rail 26, such that the slide rail 28 is telescopically movable to extend from within the rearward slide rail 26. A latch mechanism 30 is provided for latching the forward slide rail 28 in a forward position with respect to the rearward slide rail 26. The slide rail assemblies 24 each further include a forward release 32, which extends to a position that is distally removed from the latch 30. The forward release 32 is preferably disposed at the forward end of the forward slide rail 28, such that the latch 30 may be released from the forward end of the forward slide rail 28, from a position which is remote from the latch 30.

Figure 2:
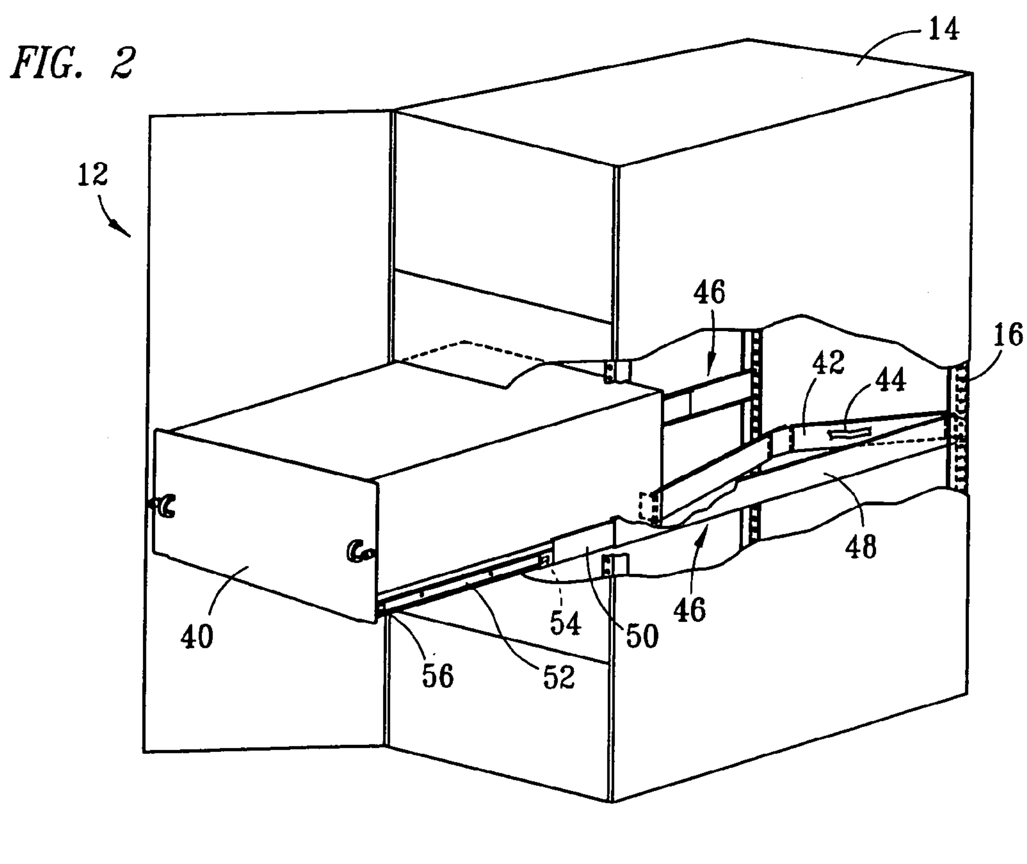
FIG. 2 is a cutaway, perspective view of an equipment cabinet having an equipment unit drawer which is mounted to the cabinet by two slide rail assemblies having latches with forward releases.

FIG. 2 is a cutaway, perspective view of the rack 12 of the equipment cabinet 14 having the frame 16. A drawer 40 is shown as an equipment unit which is mounted to the frame 16 by two slide rail assemblies 46, with one of the slide rail assemblies 46 disposed on each side of the drawer 40. A cable management arm 42 extends between the rearward end of the drawer 40 and the rearward end of the cabinet 14 to provide a flexible arm for securing cabling 44 which passes between the cabinet 14 and the drawer 40. The slide rail assemblies 46 are similar in structure to the slide assembly 24 of FIG. 1, except that the slide rail assemblies 46 include three slide rails, which are telescopically extendible. It should also be noted that although the slide rail assemblies 24 and 46 are depicted herein as ball bearing type slides, or slide rail assemblies, slide rail assemblies 24 and 46 may also be provided by friction slide rail assemblies, with similar components as those depicted herein providing latches and forward latch releases.

The slide rail assemblies 46 each include a rearward slide rail 48, which is fixedly mounted to the frame 16 such that it provides a mounting rail for respective ones of the slide rail assemblies 46. Intermediate slide rails 50 are mounted to the rearward slide rails 48, such that the intermediate slide rails 50 are telescopically extendible from the rearward slide rails 48. Forward slide rails 52 are slidably mounted to respective ones of the intermediate slide rails 50, such that the forward slide rails 52 are telescopically extendible from the respective intermediate slide rails 50. Preferably, the intermediate slide rails 50 provide first slide rails, and the forward slide rails 52 provide second rails, which are telescopically extended to forward positions with respect to respective ones of the rearward slide rails 46 and the intermediate slide rails 50. The slide rail assemblies 46 each have a latch 54 and a forwardly disposed, latch release 56. The forward ends of the latch release members 56 are distally disposed from the respective latches 54. Preferably, the forward ends of the latch releases 56 are disposed close to forward ends of the respective forward slide rail 52. The latches 54 and the release members 56 are preferably identical to the latches 30 and the forward releases 32 of the slide rail assemblies 24 of FIG. 1. As used herein, the intermediate slide rails 50 may be referred to as rearward slide rails in reference to being rearwardly disposed of respective ones of the forward slide rails 52, although such intermediate slide rails 50 may not be the rearward-most slide rails of particular slide rail assemblies. The intermediate slide rails 50 may also be referred to as being secured to the rack frames 16, for the forward slide rails 52 to telescopically extend therefrom in a cantilevered arrangement.

Figure 3:
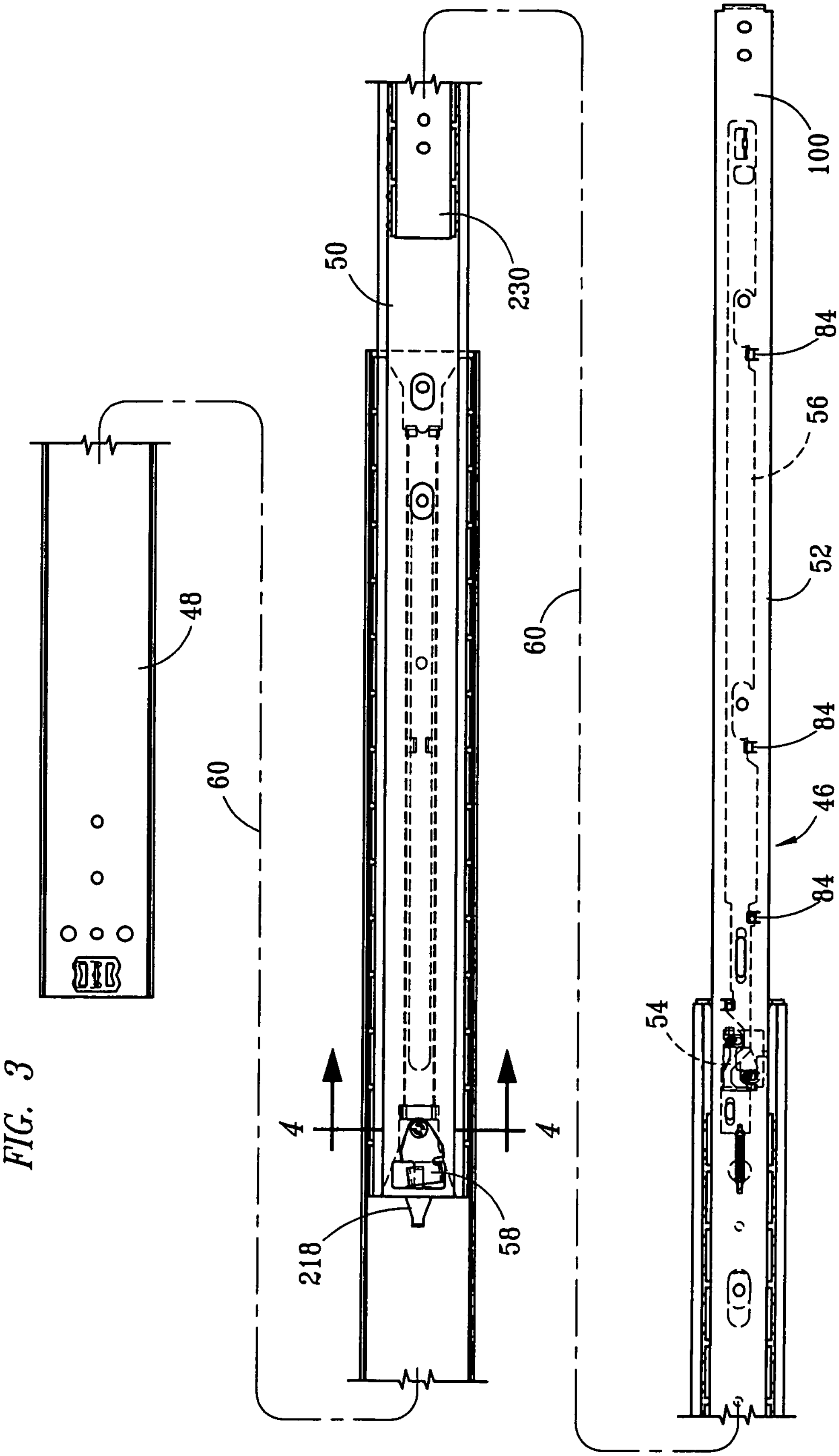
FIG. 3 is a side elevation view of a three part slide rail assembly shown after the slide rail assembly has been telescopically extended.
Figure 4:
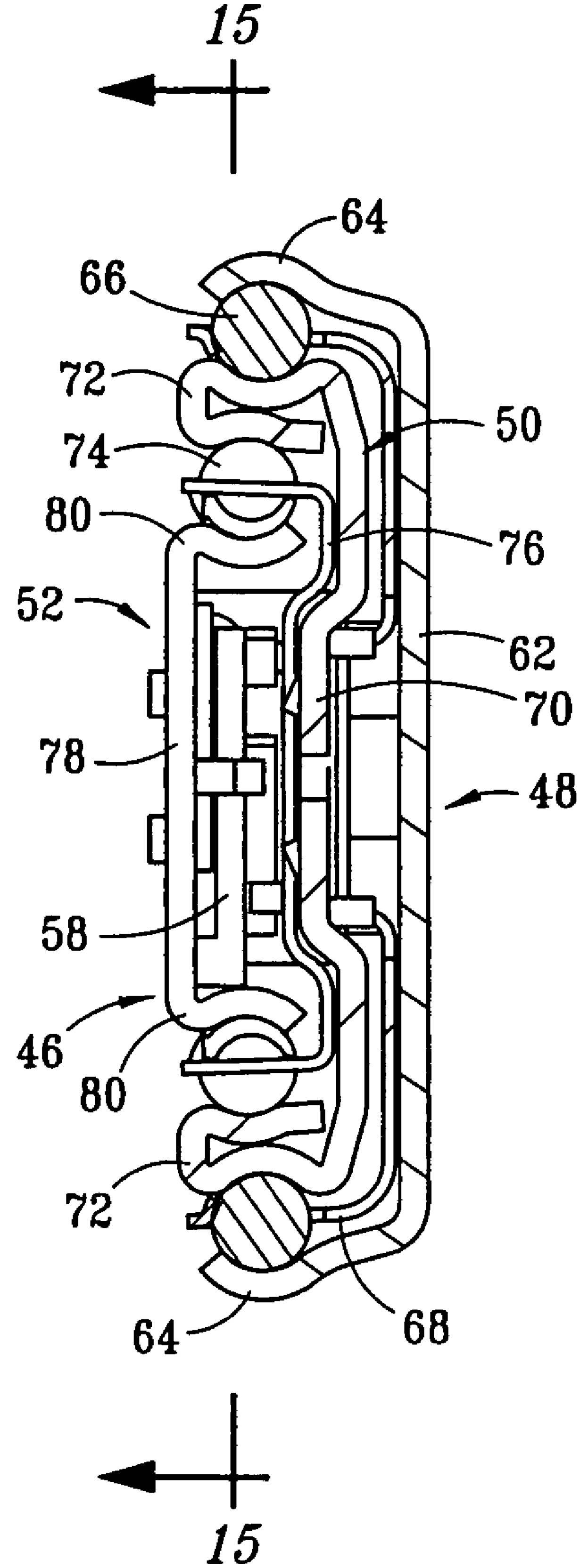
FIG. 4 is a sectional view of the slide rail assembly, taken along section line 4—4 of FIG. 3.

FIG. 3 is a side elevation view of a slide rail assembly 46, and FIG. 4 is a sectional view of the slide rail assembly 46, taken along section line 4—4 of FIG. 3. It should be noted that the various components described for the slide rail assembly 46 may be used for other telescopically extending slide rail assemblies having a different number of slide rails, such as the slide rail assemblies 24 shown in FIG. 1, and for either friction of bearing slides. The slide rail assembly 46 has a longitudinal axis 60, along which the intermediate slide rail 50 and the forward slide rail 52 are telescopically extendible in relation to the rearward slide rail 48 and the intermediate slide rail 50, respectively. The longitudinal axis 60 also extends in the direction of the lengths, that is in the direction of the longer dimensions, of the elongated bodies of the slide rails 48, 50 and 52. The rearward slide rail 48 has an elongated body, which is preferably formed of sheet metal into a channel member of a generally U-shaped cross section. The elongated body has a main portion 62, which is of a planar shape, and two edge portions 64 which are preferably arcuately shaped to define faces which provide bearing races for matingly engaging with ball bearings 66. The edge portions 64 define track members of the elongate body. The edge portions 64 may be formed as shown to provide bearing races for ball bearing slide assemblies. In some friction slide applications, the track members may be defined by terminal ends or terminal edges of slide rails, which fit within channels formed of edge portions of the slide rails for receiving the terminal edges of slide rails. Such terminal edges may provide oppositely facing track members defined by a flat slide rail, with terminal edges facing away from opposite edges of the flat slide rail, facing outward for fitting within oppositely facing track members of a second slide rail which face inward, toward one another, such as edge portions defining channels. The arcuately shaped faces of the edge portions 64 are oppositely disposed to face in inward directions, such that they will matingly engage with the ball bearings 66 which are disposed between and adjacent to respective ones of the two edge portions 64. A ball bearing retainer 68 secures the ball bearings 66 in respective relative positions.

The intermediate slide rail 50 has an elongated body, which preferably is formed of sheet metal into a channel member of a generally U-shaped cross section. The intermediate slide rail 50 has a main body portion 70, which is preferably of a planar shape and edge regions which are formed to define edge portions 72. The edge portions 72 preferably have first sides which face inward in opposite directions to define inwardly facing bearing faces for engaging ball bearings 74, and second sides which face outward in opposite directions define outwardly facing bearing faces for engaging ball bearings 66.

The forward slide rail 52 has an elongate body which is preferably formed of sheet metal into a channel member of a generally U-shaped cross section. The elongate body of the slide rail 52 has a main body portion 78 which is of a planar shape. Edge regions of the main body portion 78 extend into edge portions 80. Preferably, the edge portions 80 are formed to have outwardly, disposed bearing faces which are disposed to face in oppositely, outwardly disposed directions to provide bearing races for engaging the ball bearings 74 of the intermediate slide rail 50. The edge regions of the main body portion 78 have tabs 84 which extend from the sides of the main body portion 78, toward opposite sides of the elongate body. The tabs 84 are provided by stamping the main body portion 78, such that holes are left in the main body portion 78, adjacent to the tabs 84. The terminal ends of the tabs 84 are spaced apart from the planar surface of the outer side of the main body portion 78 for slidably retaining the forward release 56 on the slide rail 52.

Figure 5:
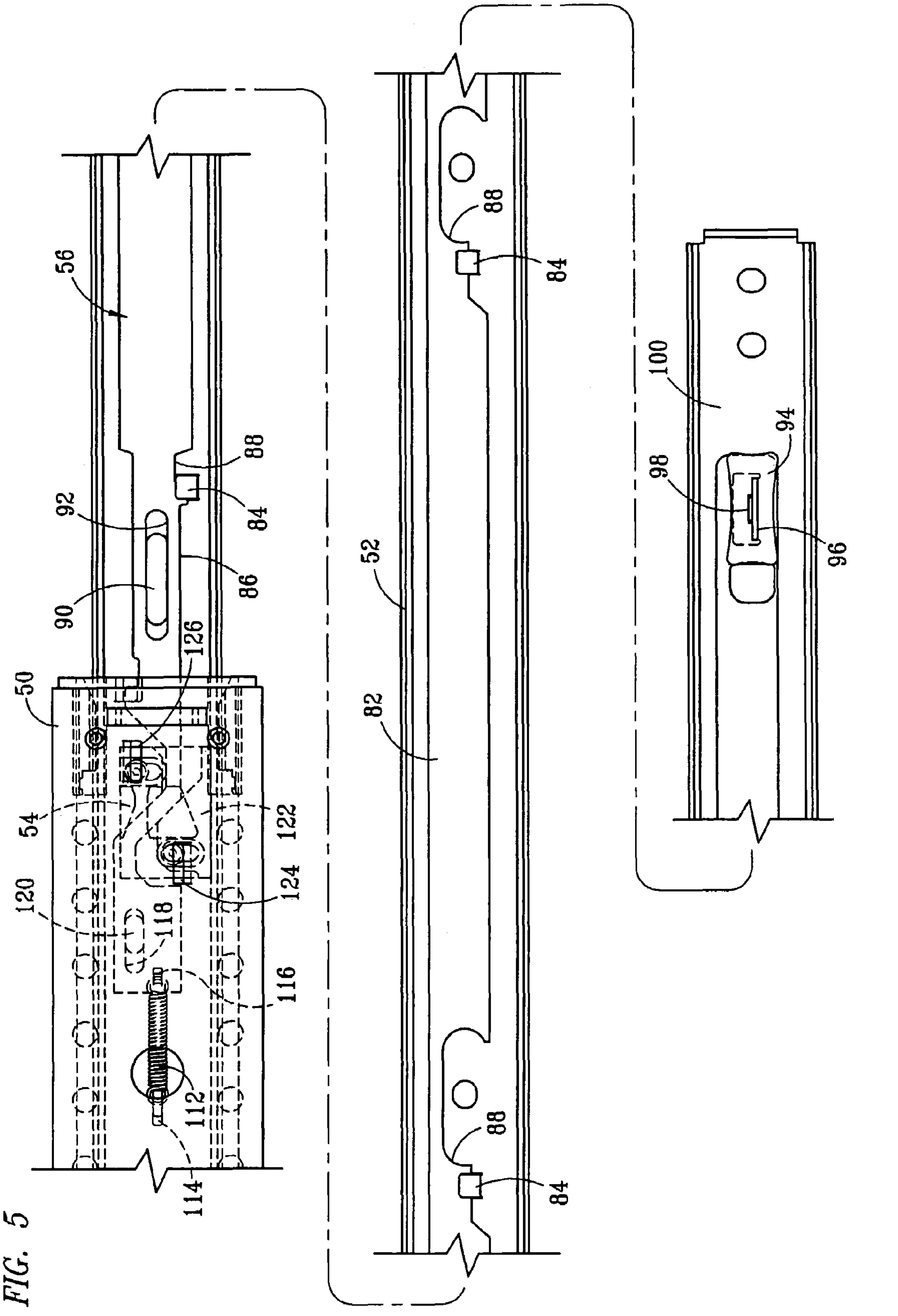
FIG. 5 is a partial, side elevation view of the slide rail assembly, showing a forward slide rail latched in a forward position, extended forward of the intermediate slide rail.
Figure 6:
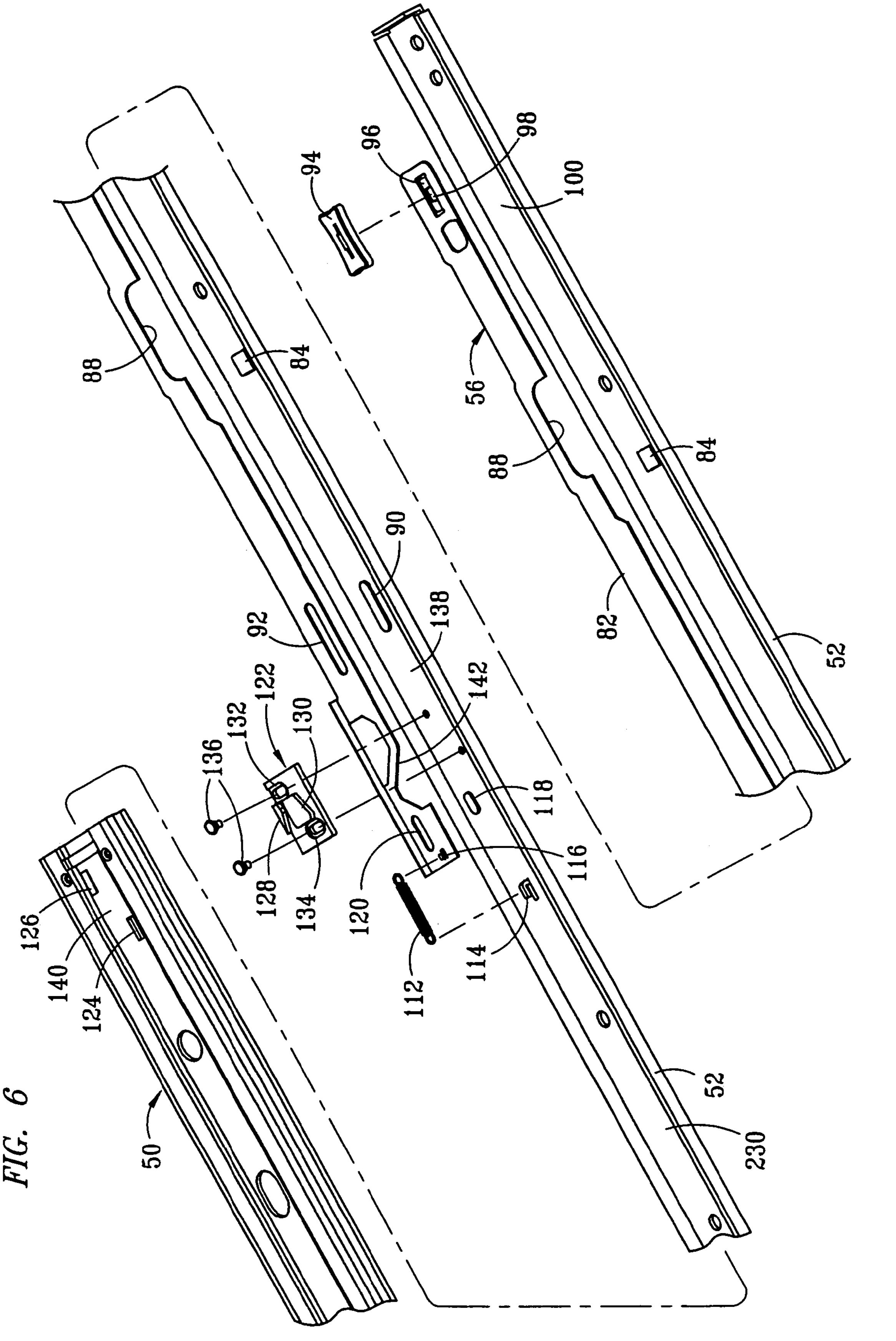
FIG. 6 is a partial, exploded view of the forward slide rail and intermediate slide rail of the slide rail assembly, showing various components of a forward latch and a forward release for the forward latch.

FIG. 5 is a partial, side elevation view and FIG. 6 is a partial, exploded view of the intermediate slide rail 50 and the forward slide rail 52. The forward release 56 is preferably provided by a rigid strip 82, of elongate shape. Preferably, the rigid strip 82 is provided by sheet metal which is formed to have a forward end with a tab 96 which is bent upwards ninety degrees to provide a tab for a user to grip the forward end portion 100 of the rigid strip of metal 82 to pull forward to release the latch 54. The strip may also be pushed rearward to engage the latch 54, to latch the forward slide rail 52 in an extended position with respect to the rearwardly disposed, intermediate slide rail 50. When disposed in the extended position, the forward slide rail 52 has a rearward region 230 which is disposed at an intermediate portion of the intermediate slide rail 50. (See FIG. 3). The rearward end of the forward release member 56 is disposed adjacent to a moveable latch member 122, which is preferably moveably mounted to the intermediate slide rail for moving in lineal directions relative to the slide rail 50. In other embodiments, a moveable latch means may be mounted to an intermediate slide rail, and the moveable latch means may be engaged by a forward release to disengage the moveable latch means from securing to a catch mounted to the forward slide rail.

The movable latch member 122 is preferably mounted to an intermediate region 138 of the forward slide rail 52 by the fasteners 136, such that the latch member 122 is slidably movable in lineal directions which are perpendicular to the longitudinal axis 60 of the slide rail assembly 46, and parallel to planar, main body surfaces of slide rails 50 and 52. The forward end of the intermediate slide rail 50 has a catch portion 140 which includes two tabs 124 and 126. The two catch tabs 124 and 126 are preferably punched out of the main body portion 70 of the forward end of the intermediate slide rail 50 to define a catch portion 140 of the intermediate slide rail 50. The two tabs 124 and 126 provide catch members which engage the moveable latch member 122 to latch the forward slide rail 52 in a fixed position relative to the intermediate slide rail 50, when the forward slide rail 52 is disposed in the forward, extended position.

Figure 7:
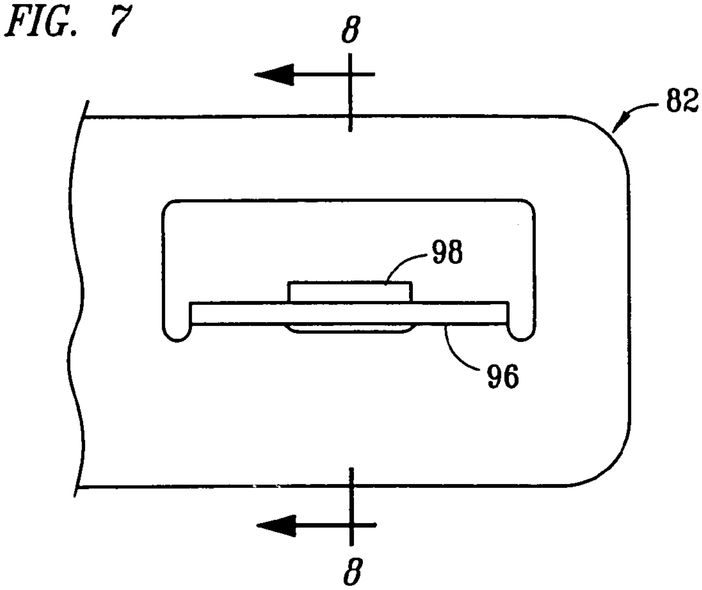
FIG. 7 is a partial side elevation view of a forward end of the forward release member.
Figure 8:
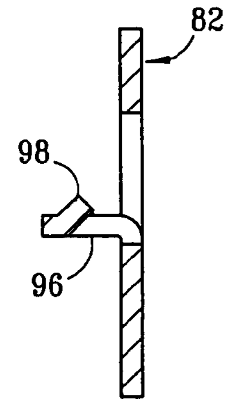
FIG. 8 is a sectional view of the forward end of the forward release member, taken along section line 8—8 of FIG. 7.

FIG. 7 is a partial side elevation view of the forward end of rigid strip 82 providing the release member 56, and FIG. 8 is a sectional view of rigid strip 82 providing the release member 56, taken along section line 8—8 of FIG. 7. A tab 96 is formed by being punched form a central portion of the body of the strip 82. The tab 96 is preferably bent at a ninety degree angle from a planar surface of the main body portion of the rigid strip 82. A catch 98 is formed by punching a portion of the main body of the tab 96 to extend aside of the main body of the tab 96. A tab member 94 is mounted to the tab 96, to provide a grip for a user to push against in operating the forward release 56.

Figure 9:
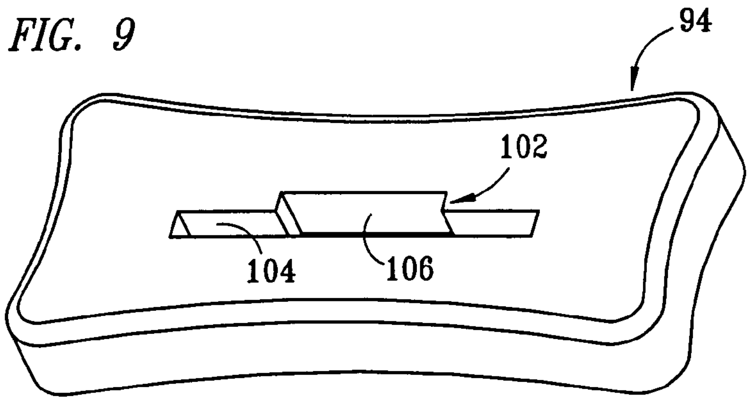
FIGS. 9, 10 and 11 are various views of a tab member 94, with FIG. 9 being a perspective view, FIG. 10 being a top view, and FIG. 11 being a sectional view taken along section line 11—11 of FIG. 10.
Figure 10:
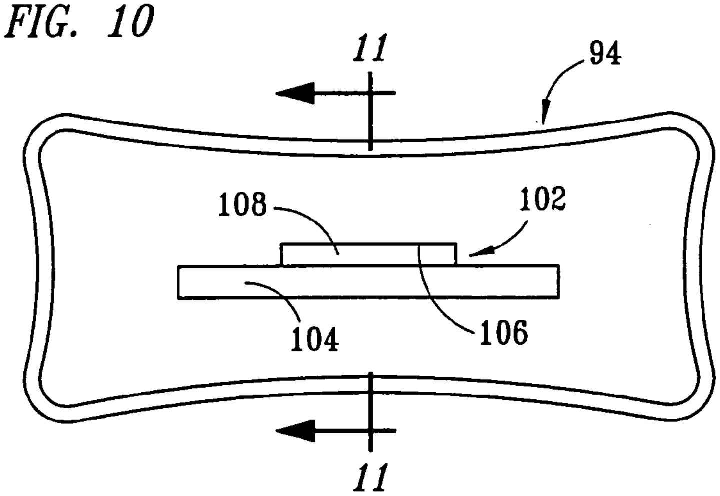
Figure 11:
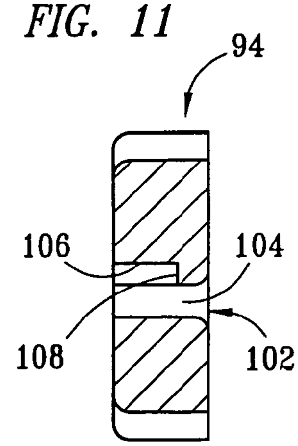

FIGS. 9, 10 and 11 are various views of the tab member 94, with FIG. 9 being a perspective view, FIG. 10 being a top view, and FIG. 11 being a sectional view taken along Section line 11—11 of FIG. 10. The tab member 94 is provided for mounting to the forward end of the release member 56 for a user to pull against for pushing the forward release member 56 forward relative to the forward slide rail 52 to release the latch 54. The tab member 94 has an aperture 102 for receiving and latching to the tab 96 of the release member 54. The aperture 102 includes a slot 104 which extends through the body of the tab member 94, and an opening 106 which extends partially through the body of the tab member 94, directly adjacent to and continuous with the slot 104. The opening 106 defines a shoulder 108 which extends adjacent to the slot 104. In securing the tab member 94 to the release member 56, the tab 96 is inserted through the slot 104 until a terminal end of the catch 98 passes adjacent to the opening 106, and then extends adjacent to the shoulder 108 to latch the tab member 94 onto the tab 96.

Figure 12:
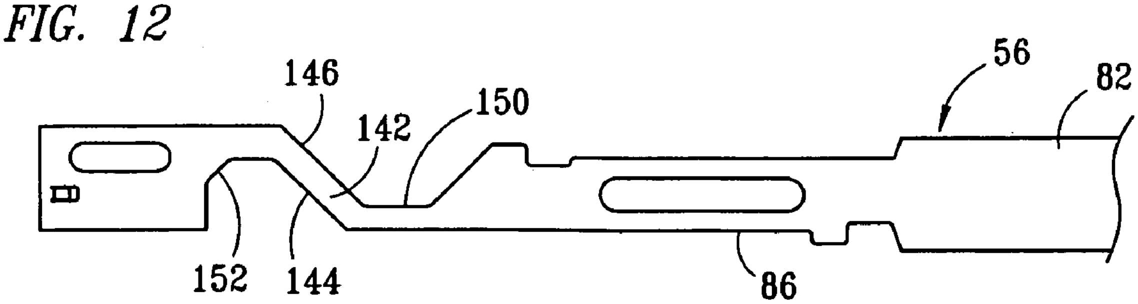
FIG. 12 is a partial, side elevation view of the rearward end of an elongated strip providing the forward release member.

FIG. 12 is a partial, side elevation view of the rearward end of the elongate strip 82 providing the release member 56. The strip 82 has a rearwardly disposed cam portion 142, with cam surfaces 144 and 146 which are defined by a portion of the edge profile 86. Recess portions 150 and 152 of the edge profile 86 are formed into the strip 82, adjacent to the cam surfaces 144 and 146. The cam surfaces 144 and 146 preferably extend at a forty-five degree angle to the longitudinal axis 60 (shown in FIG. 3) of the slide rail assembly 46. The cam surfaces 144 and 146 are provided for engaging the latch member 122, such that movement of the release member 56 causes the latch member 122 to move lineally relative to the forward slide rail 52 to which the release member 56 and the latch member 122 are mounted. Preferably, the latch member 122 is urged to move lineally, along a straight line which extends at a right angle to the longitudinal axis 60 (shown in FIG. 3) of the slide rail assembly 46 and the slide rails 48, 50 and 52, in response the release member 56 being moved lineally, along the longitudinal axis 60.

Figure 13:
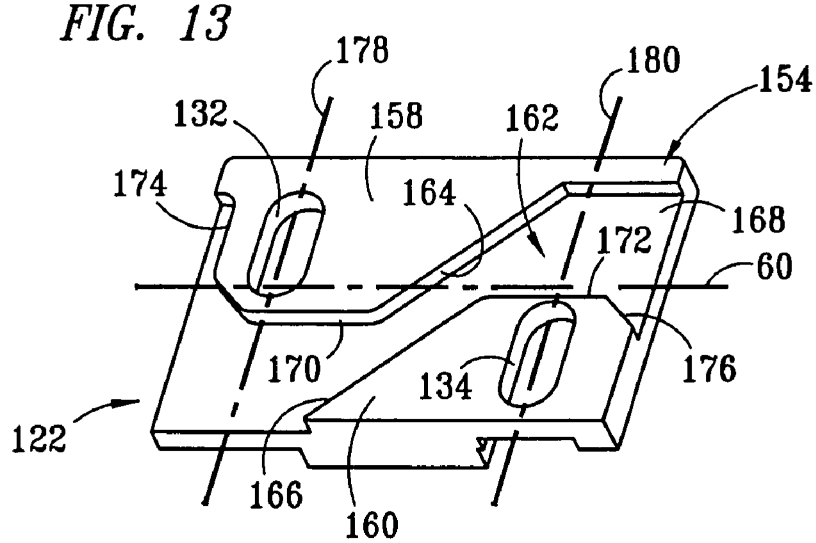
FIG. 13 and FIG. 14 are perspective views of a latch member, showing an inward side of the latch member which provides a cam follower portion, and an outward side of the latch member which provides a latch portion.
Figure 14:
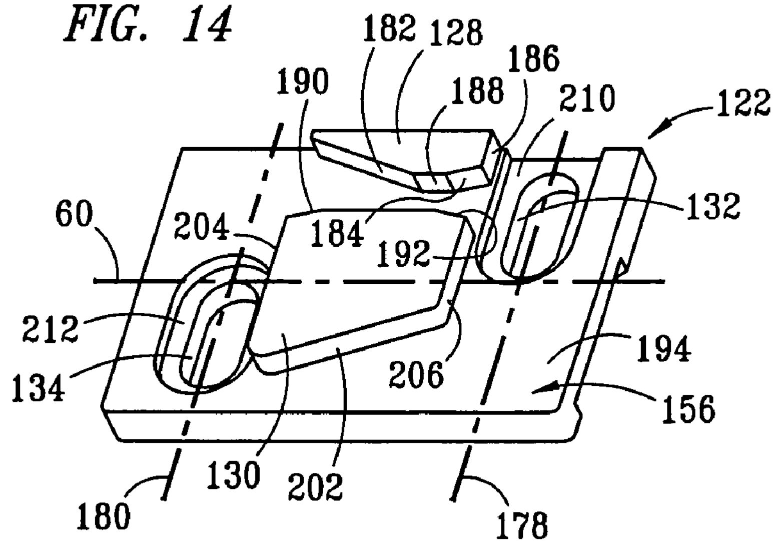

FIG. 13 and FIG. 14 are perspective views of the latch member 122, showing an inward side 154 and an outward side 156 of the latch member 122, respectively. The inward side 154 defines a cam follower portion of the latch member 122 which has two cam follower members 158 and 160 which project outward from a substantially planar surface 168 to define cam follower surfaces 164 and 166, respectively. The cam follower surfaces 164 and 166 preferably extend at a forty-five degree angle to the longitudinal axis 60. A channel region 162 extends along the planar surface 168, between the cam follower surfaces 164 and 166. The cam follower members 158 and 160 further include stop surfaces 170 and 172, respectively. The cam portion 142 of the release member 56 is sized relative to the latch member 122, such that the cam surfaces 144 and 146 fit between and engage the cam follower surfaces 164 and 166 of the cam follower members 158 and 160, respectively. A relief 174 and a relief 176 are formed into respective ones of the cam followers 158 and 160 to provide clearance with the cam portion 142 and the recess portions 150 and 152 of the rearward end of the release member 56 (shown in FIG. 12). Two apertures of elongate shape define slots 132 and 134 which extend through the latch member 122, transverse to the planar surface 168 and transverse to the longitudinal axis 60. The two elongated slots 132 and 134 extend with longitudinal lengths to define respective ones of longitudinal slot axes 178 and 180. The longitudinal axes 178 and 180 define a latch axis, along which said latch member 122 is slidably moved relative to the second, or forward, slide rail 52. The slots 132 and 134, and the fasteners 136 (shown in FIG. 6) are sized such that shanks of the fasteners 136 may move relative to the latch member 122 along the longitudinal axes 178 and 180, within respective ones of the slots 132 and 134. Preferably, the slot longitudinal axes 178 and 180 extend parallel to the planar surface 168 and perpendicular, or orthogonal, to the longitudinal axis 60 of the slide rail assembly 46.

The outward side 156 of the latch member 122 defines a latch portion which has stop members 128 and 130, which preferably provide protruding, or protuberant, members which extend outward of a planar surface 194. The stop member 128 has a guide surface 182, a flat 188, a guide surface 184 and a stop surface 186. The stop surface 186 preferably faces in a forward direction, and extends in a direction which is perpendicular to the longitudinal axis 60 and perpendicular to the planar surface 194. The stop member 130 has a guide surface 202, a stop surface 204, a stop surface 206, and guide surfaces 190 and 192, which extend on opposite sides of a flat. The stop surfaces 204 and 206 face in opposite directions, with stop surface 204 preferably facing rearward and stop surface 206 preferably facing forward. Preferably, the stop surfaces 204 and 206 are parallel, and perpendicular to the longitudinal axis 60 and the planar surface 194. The stop surface 206 of the stop member 130 and the stop surface 186 of the stop member 128 are preferably coplanar. The elongate slots 132 and 134 extend with longitudinal axes 178 and 180, respectively, which extend perpendicular to the longitudinal axis 60. Recesses 210 and 212 extend adjacent to the inward sides of the slots 132 and 134, providing clearance for receiving the heads of the fasteners 136. Shoulders defined by the recesses 210 and 212 are preferably parallel to the planar surface 194.

Figure 15:
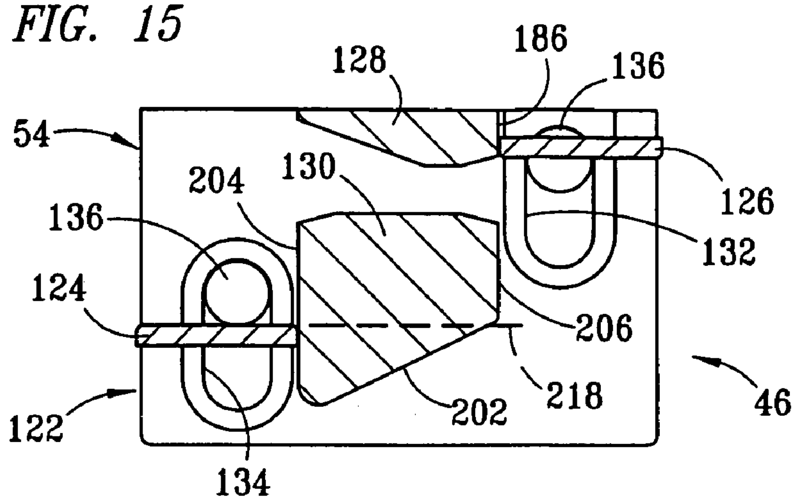
FIGS. 15, 16 and 17 are partial section views of the slide rail assembly, taken along section line 15—15 of FIG. 4, and show, in side elevation, positioning of the latch member relative to two catch tabs for operation of a latch mechanism.
Figure 16:
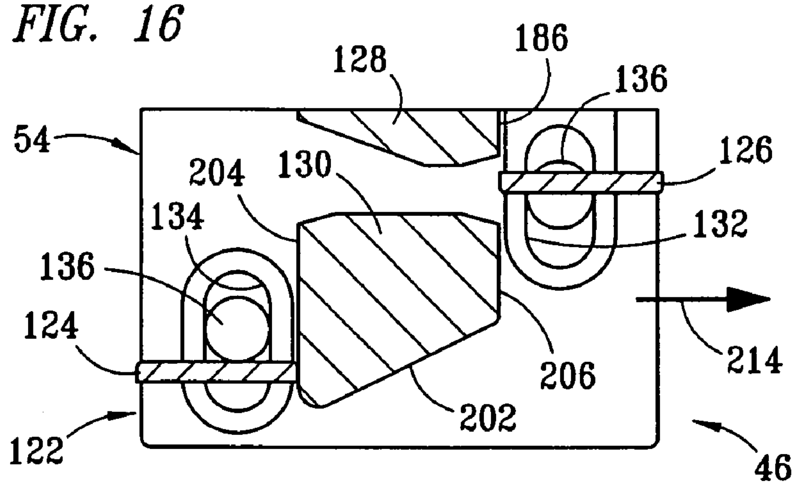
Figure 17:
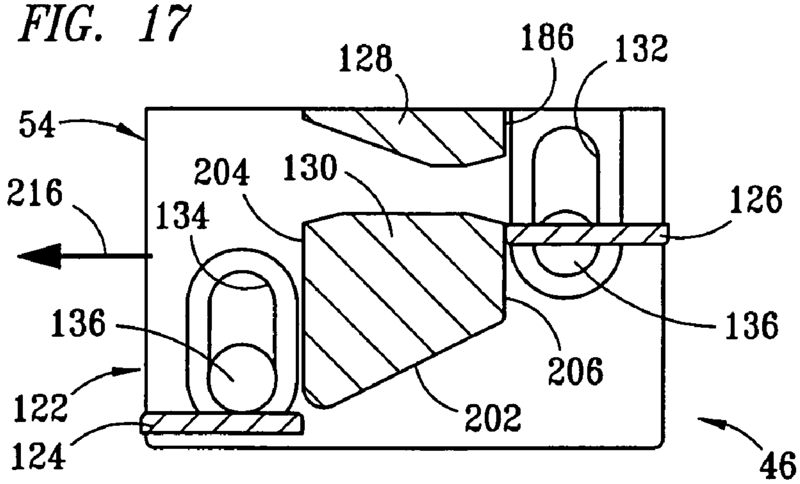

FIGS. 15, 16 and 17 are partial section views of the slide rail 46, taken along section line 15—15 of FIG. 4, and show, in side elevation, positioning of the latch member 122 relative to the two catch tabs 124 and 126 for operation of the latch 54. The latch member 122 is mounted to the forward slide rail 52, such that the latch member 122 is slidably moveable relative to the main body portion 78 of the forward slide rail 52. (See FIGS. 4 and 5). Preferably, the latch member 122 is moveable only in a lineal direction relative to the main body portion 78 of the slide rail 52. For the slide rail assembly 46, the member 122 is lineally moveable in a vertical direction which is perpendicular to the longitudinal axis 60 of the slide assembly 46, and in a plane which is parallel to the main body portions 62, 70 and 78 of the slide rails 48, 50 and 52, respectively. The fasteners 136 and the catch tabs 124 and 126 remain at fixed relative elevations, with the fasteners 136 being rigidly mounted to the forward slide rail 52, spaced apart at fixed elevations, and the catch tabs 1-24 and 126 being formed from the intermediate slide rail 50 at fixed relative elevations. The latch member 122 is moveable relative to the fasteners 136 and the catch tabs 124 and 126 such that when the latch member 122 is located in a first position, a latched position, disposed fully downward in a lowermost position relative to the slide rail 52 to which is it mounted, which is shown in FIG. 15, then the shanks of the fasteners 136 are disposed in fully upward positions within respective ones of the slots 132 and 134. When the latch member 122 is disposed in a second position, a partially latched position, or the middle position, which is shown in FIG. 16, the shanks of the fasteners 136 will be disposed in intermediate positions within respective ones of the slots 132 and 134. When the latch member 122 is disposed in a third position, an unlatched position, in which the latch member 122 is disposed in a upward, or uppermost position, relative to the slide rail 52 to which is it mounted, which is shown in FIG. 17, then the shanks of the fasteners 136 will be disposed in a lowermost position within respective ones of the slots 132 and 134.

The lineal direction in which the latch member 122 is free to move is preferably determined by the size and positioning of the slots 132 and 134 in the latch member 122 relative to the size and positioning of the shanks for the fasteners 136. The slots 132 and 134 are sized for slidably receiving the shanks of the fasteners 136 to slidably secure the latch member 122 to the forward slide rail 52, preferably such that the latch member may only move upwards and downwards relative to the forward slide rail 52. The cam portion 142 of the release member 56 inter-fits within the channel section 162 of the latch member 122, such that cam surfaces 144 and 146 of the cam portion 142 press against the cam follower surfaces 164 and 166, respectively, to determine the vertical position that the latch member 122 is disposed relative to the forward slide rail 52. As discussed above, the relative position of the release member 56 forward or rearward relative to the slide rail 52, to which the release member 56 is mounted, determines the positioning of the cam surfaces 144 and 146 relative to the follower surfaces 164 and 166 of the latch member 122, and the vertical position of the latch member 122 relative to the forward slide rail 52. This arrangement provides for positive placement of the latch member 122, that is, the operator may determine the precise location of the latch member 122 relative to the stop tabs 124 and 126 in operating the forward latch, by selectively positioning the forward release member 56.

FIG. 15 shows the latch member 122 disposed in a fully downward position relative to the fasteners 136 and the catch tabs 124 and 126. The latch member 122 is disposed in the downward, latched position shown in FIG. 15 when the latch release member 56 disposed in a fully rearward position relative to the forward slide rail 52. The cam surfaces 144 and 146 of the cam portion 142 of the release member 56, which are disposed between the cam follower surfaces 164 and 166 of the latch member 122 (shown in FIGS. 12–14), locate the latch member 122 in the latched position, disposed fully downward relative to the catch tabs 124 and 126. The spring 112 (shown in FIGS. 5 and 6) provides a bias member which pulls and then retains the release member 56 in the rearward position relative to the forward slide rail 52. When the latch member is disposed in the fully downward position, the catch tab 124 is disposed adjacent to the stop surface 204 of the member 130 and the catch tab 126 is disposed adjacent to the stop surface 186 of the member 128, preventing the latch member 122 from moving in forward and rearward directions relative to the catch tabs 124 and 126, and latching the forward slide rail 52 from moving relative to the intermediate slide rail 50. Preferably, the guide surface 202 is provided such that when the latch member 54 is disposed in the latched position, shown as the fully downward position in FIG. 15, the guide surface 202 extends to an elevation which is slightly above the elevation 218 (shown as a dashed line) of the top of the tab 124, such that when the inner slide rail 52 is pulled forward relative to the intermediate slide rail 50 (see FIGS. 3 and 5), the guide surface 202 of the protruding member 130 will engage the catch tab 124 and move upwards and over the catch tab 124 and into the latched position shown in FIG. 15. The cam follower surfaces 164 and 166 will engage the cam surfaces 144 and 146, respectively, to cause the forward release member 56 to move forward relative to the forward slide rail 52 after the force of the bias spring 112 is overcome.

FIG. 16 shows the relative position of the latch member 122 mounted to the forward slide rail 52 and the catch tabs 124 and 126 of the intermediate slide rail 50 after the latch release member 56 is moved forward to an intermediate position relative to the forward slide rail 52. With the release member 56 disposed in the intermediate position, the cam surfaces 144 and 146 of the cam portion 142 of the forward release member 56 are thereby moved to intermediate positions, which causes the cam surface 144 to push against the cam follower surface 164 and the cam surface 146 to press against the cam follower surface 166, to position the latch member 122 in a second, partially latched position, disposed in a middle position which is upward of the position shown in FIG. 15. With the latch member 122 disposed in the middle position, the catch tab 124 is adjacent to the stop surface 204 of the stop member 130, preventing the latch member 122 from moving rearward. The catch tab 126 is aligned with a space which extends between the stop members 128 and 130, such that the catch tab 126 is free to move between the stop members 128 and 130, and the latch member 122 is free to move in the forward direction 214, relative to the catch tabs 124 and 126. Thus, when the latch member 122 is disposed in the second, middle position, the forward slide rail 52 may be moved forward, but not rearward, relative to the intermediate slide rail 50.

FIG. 17 shows the relative position of the latch member 122 and the catch tabs 124 and 126 after the latch release member 56 is moved to a forward position relative to the forward slide rail 52. With the release member 56 in the forward position, the cam surfaces 144 and 146 of the cam portion 142 of the forward release member 56 are thereby moved to forward positions, which causes the cam surface 144 to push against the cam follower surface 164 and the cam surface 146 to press against the cam follower surface 166, to position the latch member 122 in a third position, an upward position, in which the latch member 122 is disposed at a higher elevation than the positions shown in FIGS. 15 and 16. With the latch member 122 disposed in the third position, an unlatched position, disposed fully upward in relation to the forward slide rail 52 and the fasteners 136, the catch tab 126 is located adjacent to the stop surface 206 of the stop member 130, preventing the latch member 122 from moving in a forward direction. The catch tab 124 is aligned rearward and adjacent to a space which extends aside of and beneath the stop member 130, such that the catch tab 124 is free to move past the stop member 130, and the latch member 122 is free to move in a rearward direction 216, relative to the catch tabs 124 and 126. Thus, when the latch member 122 is disposed in the third, upward position, the forward slide rail 52 may be moved rearward, but not forward, relative to the intermediate slide rail 50.

Figure 18:
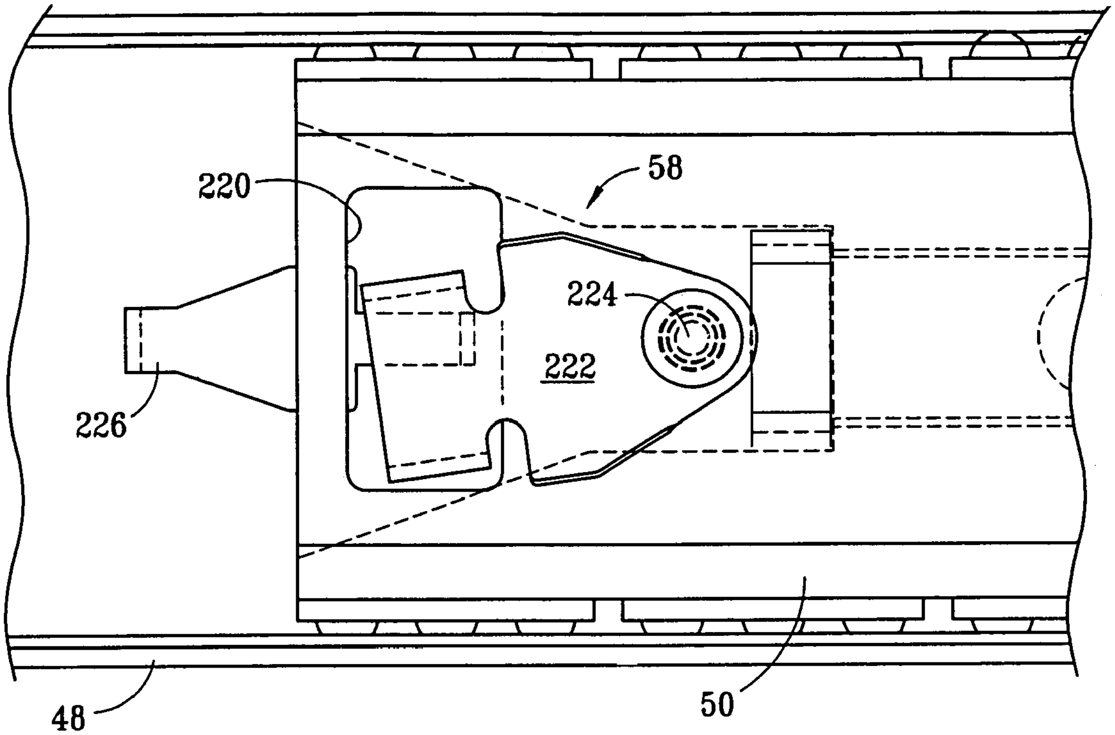
FIG. 18 is a partial, side elevation view of the slide rail assembly, showing a rearward latch used to latch the intermediate slide rail in an outwardly disposed, extended position relative to the rearward slide rail.

FIG. 18 is a partial, side elevation view of slide rail assembly 46, showing the rearward latch 58 used to latch the intermediate slide rail 50 in an outwardly disposed, extended position relative to the rearward slide rail 48. The latch 58 includes a toggle 222 which is pivotally connected to the intermediate slide rail 50 by a pivot pin 224. A latch member 226 is preferably formed by punching the central portion of the forward end of the rear slide rail 48, to create a raised member which is rigidly connected to the rear slide rail 48. The rearward end of the latch member 226 has cam surfaces for guiding the flange portions of the toggle 222, such that toggle 222 will pass over the latch member 226 when the intermediate slide rail 50 and the toggle 222 are pulled forward relative to the rearward slide rail 48 and the latch member 226.

Figure 19:
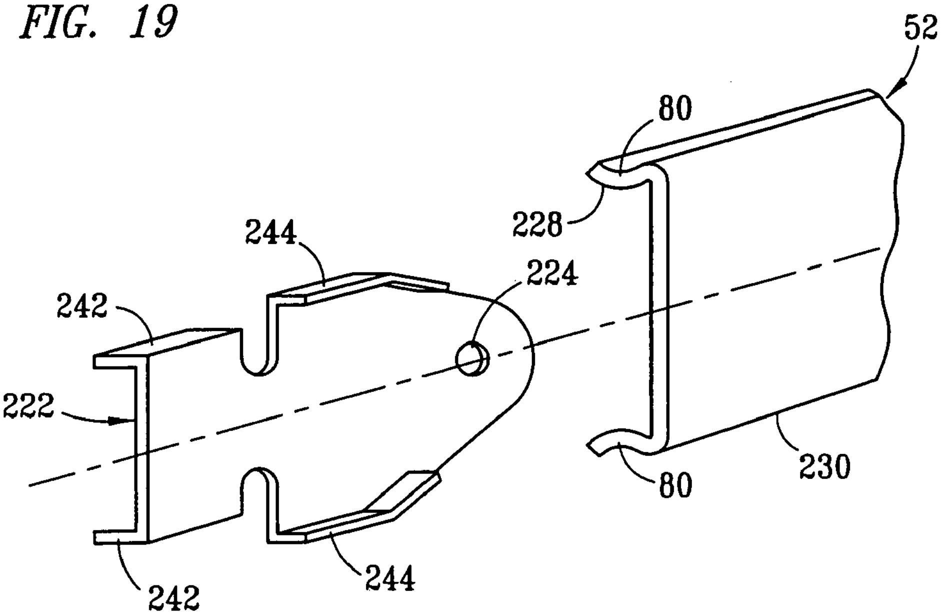
FIG. 19 is a partial, perspective view of the operative components of the rearward latch of the slide rail assembly.

FIG. 19 is a partial, perspective view of the components of the rear latch 58 for the slide rail assembly 46. The toggle 222 is shown having a main body portion and two catch ears 242 which extend outward from a rearward end of the toggle 222. The two catch ears 242 extend through the window opening 220 in the intermediate slide rail 50. (See FIG. 18). When the intermediate slide rail 50 is in the extended position relative to the rear slide rail 48, the two catch ears 242 engage a shoulder of the latch member 226 to prevent the intermediate slide rail 50 from moving rearward relative to the rear slide rail 48, until the forward slide rail 52 is moved into a retracted position. The toggle 222 has two release ears 244 which extend from a forward end of the main body portion of the toggle 222, on an opposite side of the toggle 222 from the two catch ears 242. The two release ears 244 taper in a forward direction for engaging within a rearward end portion 230 of the forward slide rail 52. The end portion 230 of the forward slide rail 52 has the oppositely facing edge, track portions 80 which are formed to define an interior profile 228. The interior profile 228 is defined such that rearward movement of the inner, forward slide rail 52 into a fully rearward position engages the interior profile 228 with the release ears 244 of the toggle 222, and centers the toggle 222 relative to the longitudinal axis 60 of the slide rail assembly 46 (see FIG. 3). Centering the toggle 222 aligns the two catch ears 242 for passing over the latch member 226 so that the intermediate slide rail 50 may be moved rearward relative to the rear slide rail 48.

Slide rail assemblies made according to the present invention provide advantages over prior art slide rail assemblies. Slide rail assembly latches having forward releases are easier to use than release latches which are operated by a user at interfaces between two mating slide rails, especially when such slide rail assemblies are used to support drawers of larger size. Forward releases allow users to operate release latches at points which are distal from pinch points defined by the interfaces between the two slide rails, preventing injuries to users. The slide rail disclosed herein has a latch member with cam follower surfaces which are engaged by cam surfaces of a cam portion of the forwardly extending release member, such that forward movement of the release member urges the latch member to move in a lineal direction which is perpendicular to the direction in which the release member is moved, releasing the latch member from engaging two catch tabs of the intermediate slide rail and thereby releasing the forward slide rail for moving relative to an intermediate slide rail. It should also be noted that slide rail assemblies and forward release members may be formed of materials other than metal, such as molded plastics. Preferably, the latch member is formed of plastic, but may also be formed of metals and other suitable materials.

Although the preferred embodiment has been described in detail, it should be understood that various changes, substitutions and alterations can be made therein without departing from the spirit and scope of the invention as defined by the appended claims.

What is claimed is:

1. A slide rail assembly comprising:

a first slide rail having a first elongate body and a first latch member, said first latch member having at least one tab;

a second slide rail having a second elongate body and a second latch member, said second latch member having at least one protuberant member;

wherein said first and second slide rails are coupled together in moveable relation for slidably moving said second slide rail relative to said first slide rail along a longitudinal axis of said slide rail assembly and into a forward position, with said second latch member aligned with said first latch member, wherein one of said first and second latch members is moveable relative to an other of the first and second latch members to engage said at least one tab of said first latch member and said at least one protuberant member of said second latch member, such that said first and second latch members releasibly engage to latch said second slide rail in said forward position relative to said first slide rail;

a release member moveably mounted to said second slide rail, said release member extending from a portion of said second slide rail which is distally disposed from said first slide rail to said one of said first and second latch members when said second slide rail is disposed in said forward position, said release member being moveable to movably engage said one of said first and second latch members to move said one of said first and second latch members relative to said other of said first and second latch members to release said first and second latch members from engaging and release said second slide rail for moving from said forward position relative to said first slide rail; and wherein said one of said first and second latch members which is moveably engaged by said release member is moved lineally relative to said other of said first and second latch members and lineally relative to said first and second slide rails in a direction which is at least in part orthogonal to said longitudinal axis, to release said second slide rail for moving from said forward position.

2. The slide rail assembly according to claim 1, wherein said release member moveably engages said second latch member to lineally move said second latch member and release said second latch member from engaging said first latch member and release said second slide rail from said forward position, extended forward of said first slide rail.

3. The slide rail assembly according to claim 2, wherein said second latch member includes a cam follower member and said release member includes a cam portion, wherein said cam follower is engaged by said cam portion and urged to lineally move relative to said second latch member and release from said first latch member in response to movement of said release member.

4. The slide rail assembly according to claim 1, wherein said second slide rail comprises a plurality of tabs which extend from at least one region of said second elongated body, with end portions spaced apart from a main portion of said second elongated body and aside of said release member, such that said release member is moveably retained on said second slide rail.

5. The slide rail assembly according to claim 1, wherein said first and second slide rails are formed of metal.

6. The slide rail assembly according to claim 1, wherein said slide rail assembly comprises a bearing slide assembly.

7. The slide rail assembly according to claim 1, further comprising:

said first latch member having two catch tabs, one of which defines said at least one tab, said two catch tabs defined in spaced apart relation for being selectively engaged with said second latch member for selectively securing said first and second slide rails in fixed relative relation;

said second latch member being moveably secured to said second slide rail, and said second latch member having an inward side and an outward side;

said inward side being formed to define a substantially planar inward surface and two cam follower members which protuberantly extend to project inward from said substantially planar inward surface to define cam follower surfaces;

said outward side of said second latch member being formed to define a substantially planar outward surface and two protruding stop members which extend in an outward direction from said substantially planar outward surface, said stop members having outward stop surfaces and outward guide surfaces which extend substantially transverse to said substantially planar outward surfaces and a longitudinal axis of said first and second slide rails, said outward stop surfaces and said outward guide surfaces being formed for selectively engaging said two catch tabs of said first slide rail;

said release member including a cam portion having cam surfaces, wherein said cam follower members of said second latch member and said release member are configured such that said cam surfaces fit between and engage said cam follower surfaces of said cam follower members, such that movement of said release member in directions which extend along said longitudinal axis of said first and second slide rails moves said second latch member in directions which extend substantially transverse to said longitudinal axis of said first and second slide rails; and wherein said release member is selectively moved along said longitudinal axis of said first and second slide rails to lineally move said second latch member to move in directions substantially transverse to said longitudinal axis, and selectively position said two protruding stop members of said latch member relative to said two catch tabs of said first slide rail to selectively latch said first and second slide rails in fixed relative relation.

8. The slide rail assembly according to claim 7, wherein movement of said release member along said longitudinal axis of said first and second slide rails selectively moves said second latch member orthogonal to said longitudinal axis.

9. A slide rail assembly comprising:

a first slide rail having a first elongated body, wherein said first elongated body has first track members being spaced apart to extend in an oppositely facing arrangement along at least part of a longitudinal length of said first elongated body;

a catch member mounted to said first elongate body;

a second slide rail having a second elongated body, wherein said second elongated body has forward section, a rearward section and an intermediate section disposed between said forward and rearward sections, and said second elongated body further including second track members which extend lengthwise along at least part of said second elongated body in a spaced apart, oppositely facing alignment for moveably engaging said first track members of said first elongated body;

a latch member mounted to said second elongate body in said intermediate section of said second elongate body for lineally moving relative to said second elongate body to engage said catch member of said first elongate body;

wherein second slide rail is telescopically extensible relative to said first slide rail along a longitudinal axis of said first and second slide rails, from a retracted position to a fixed, forward position in which said forward section and at least part of said intermediate section is disposed forward of said first slide rail in which said latch member is aligned with said catch member, such that said latch member will releasibly engage said catch member to engage said second slide rail in said fixed, forward position;

said second slide rail having a plurality of tabs which extend from edge regions of said second slide rail toward opposite edge regions of said second slide rail, such that said tabs extend transverse to said longitudinal axis of said first and second slide rails, spaced apart from a main portion of said second elongated body and aside of a rigid release member; and said rigid release member formed of a strip of metal, having a length which extends parallel to longitudinal axes of said first and second slide rails, said rigid release member slidably extending between said plurality of tabs and said main portion of said elongated body of said second slide rail, from said forward section to said intermediate section of said second slide rail, such that said rigid release member is disposed in alignment for slidably moving relative to said second slide rail to engage said latch member to move said latch member from engaging said catch member and unlatch said second slide rail for moving from said fixed, forward position relative to said first slide rail.

10. The slide rail assembly according to claim 9, wherein said latch member comprises a cam follower portion on a first side and a latch portion on a second side, and said release member includes a cam portion which engages said cam follower portion of said latch member to move said latch portion thereof relative to said catch member, to release said second slide rail for moving relative to said first slide rail.

11. The slide rail assembly according to claim 10, wherein said catch member is defined by at least one catch tab which rigidly extends from said first slide rail for engaging said latch portion of said latch member, and said latch member is slidably mounted to said second slide rail.

12. The slide rail assembly according to claim 9, further comprising:

said catch member having two catch tabs, defined in spaced apart relation for being selectively engaged with said latch member for selectively securing said first and second slide rails in fixed relative relation;

said latch member having an inward side and an outward side;

said inward side being formed to define a substantially planar inward surface and two cam follower members which protuberantly extend to project inward from said substantially planar inward surface to define cam follower surfaces;

two apertures of elongate shape formed into said latch member to define slots having longitudinal slot axes which extend through said latch member, substantially transverse to said planar surface and said longitudinal axis of first and second said slide rails;

two fasteners secured to said second slide rail, and slidably extending within respective ones of said two apertures of elongate shape, such that said latch member is slidably secured to said second slide rail for moving in lineal directions relative said second slide rail which are substantially transverse to said longitudinal axis;

said outward side of said latch member being formed to define a substantially planar outward surface and two protruding stop members which extend in an outward direction from said substantially planar outward surface, said stop members having outward stop surfaces and outward guide surfaces which extend substantially transverse to said substantially planar outward surfaces and said longitudinal axis of said first and second slide rails, said outward stop surfaces and said outward guide surfaces being formed for selectively engaging said two catch tabs of said first slide rail;

said release member including a cam portion having cam surfaces, wherein said cam follower members of said latch member and said release member are configured such that said cam surfaces fit between and engage said cam follower surfaces of said cam follower members, such that movement of said release member in directions which extend along said longitudinal axis of said first and second slide rails moves said latch member along said longitudinal slot axes, in directions which extend substantially transverse to said longitudinal axis of said first and second slide rails; and wherein said release member is selectively moved along said longitudinal axis of said first and second slide rails to lineally move said second latch member to move in directions substantially transverse to said longitudinal axis, and selectively position said two protruding stop members of said latch member relative to said two catch tabs of said first slide rail to selectively latch said first and second slide rails in fixed relative relation.

13. The slide rail assembly according to claim 12, wherein:

said cam follower members of said inward side of said latch member further include stop surfaces, which extend substantially orthogonal to said substantially planar inward surface and said longitudinal axis of said first and second slide rails;

said cam follower surfaces extend at a forty-five degree angle to said longitudinal axis, and substantially orthogonal to said substantially planar inward surface;

wherein said longitudinal slot axes of said two apertures of elongate shape formed into said latch member extend at right angles to said longitudinal axis of first and second said slide rails; and wherein said release member is selectively moved along said longitudinal axis of said first and second slide rails, which selectively moves said latch member orthogonal to said longitudinal axis.

14. The slide rail assembly according to claim 13, wherein said substantially planar inner surface and said substantially planar outward surface are parallel.

15. In a slide rail assembly having first and second slide rails, said first and second slide rails having respective elongated bodies which define a longitudinal axis and edge portions which slidably engage, such that said second slide rail is moveable relative to said first slide rail along said longitudinal axis, the improvement comprising:

a latch having a first latch member included as part of said first slide rail, said first latch member having a catch tab, and a second latch member included as part of said second slide rail, said second latch member having a protuberant member, wherein one of said first and second latch members is lineally moveable relative to an other of said first and second latch members along a latch axis which, at least in part, extends orthogonal to said longitudinal axis defined by said first and second slide rails, and movement of said second slide rail relative to said first slide rail and along said longitudinal axis into a latch position aligns said catch tab of said first latch member with said protuberant member of and second latch member such that said one of said first and second latch members lineally moves along said latch axis and releasibly engages said other of first and second latch members to secure said second slide rail in said latch position, in fixed relation to said first slide rail; and a rigid release member moveably mounted to said second slide rail, said rigid release member extending from a portion of said second slide rail which is distally disposed from said first slide rail to said one of said first and second latch members when said second slide rail is disposed in said latch position, such that said rigid release member is moveable for urging said one of said first and second latch members to lineally move along said latch axis and release said first and second latch members from engaging, moving one of said catch tab and said protuberant member relative to said other of said catch tab and said protuberant member, to release said second slide rail for moving relative to said first slide rail and from said latch position.

16. The slide rail assembly according to claim 15, wherein said rigid release member comprises a cam portion and said second latch member comprises a first side from which extends at least one protuberance which defines a cam follower portion which is engaged by said cam portion of said rigid release member, such that movement of said rigid release member along said second slide rail urges one of said first and second latch members to lineally move along said latch axis and releases said one of said first and second latch members from engaging said other of said first and second latch members.

17. The slide rail assembly according to claim 16, wherein said second latch member is moveable relative to said first latch member in response to movement of said rigid release member, and said second latch member comprises a second side having a second protuberance which defines said protuberant member for engaging said catch tab of said first latch member, said first latch member having said catch tab which is releasibly engaged by said second protuberance for securing said second slide rail in said latch position, in fixed relation to said first slide rail.

18. The slide rail assembly according to claim 17, wherein said catch tab of said first latch member is formed from a main body portion of said first slide rail, said second latch member comprises two slots which are spaced apart and extend through a main body of said second latch member with elongated shapes that are orthogonal to said longitudinal axis, and wherein said two slots are elongated for receiving shanks of respective fasteners which secure said second latch member to said second slide rail and defines said latch axis along which said second latch member is moveable.

19. The slide rail assembly according to claim 15, further comprising:

said first latch member having said catch tab, defined for being selectively engaged with said second latch member to selectively secure said first and second slide rails in fixed relation;

said second latch member having an inward side and an outward side;

said inward side being formed to define a cam follower member which protuberantly extends to project inward from said latch member to define a cam follower surface;

at least one aperture of elongate shape formed into one of said second slide rail and said second latch member, said at least one aperture having a longitudinal slot axis which extends substantially transverse to said longitudinal axis of first and second said slide rails and which defines said latch axis;

at least one fastener secured to said second slide rail and said second latch member, and slidably extending within said at least one aperture of elongate shape, such that said second latch member is slidably secured to said second slide rail for moving along said latch axis, in lineal directions relative said second slide rail which are substantially transverse to said longitudinal axis;

said outward side of said second latch member being formed to define said protuberant member which extends in an outward direction from said second latch member, said protuberant member having outward stop surface which extends substantially transverse to said longitudinal axis of said first and second slide rails, said outward stop surface being formed for selectively engaging said catch tab of said first, slide rail;

said release member including a cam portion which defines a cam surface, wherein said cam portion and said cam follower member of said second latch member are configured such that said cam surface engages said cam follower surface, such that movement of said release member in directions which extend along said longitudinal axis of said first and second slide rails moves said second latch member along said longitudinal slot axis, in directions which extend substantially transverse to said latch axis of said first and second slide rails; and wherein said release member is selectively moved along said longitudinal axis of said first and second slide rails to lineally move said second latch member to move in directions substantially transverse to said longitudinal axis, and selectively position said protuberant member of said latch member relative to said catch tab of said first slide rail to selectively latch said first and second slide rails in fixed relative relation.

20. The slide rail assembly according to claim 19, wherein said longitudinal slot axis of said at least one aperture of elongate shape formed into said one of said second slide rail and said second latch member extends at a right angle to said longitudinal axis of first and second said slide rails, such that said second latch member is moved orthogonal to said longitudinal axis in response to said release member being moved along said longitudinal axis of said first and second slide rails.

* * * * *